(12) United States Patent
Satoh et al.

(10) Patent No.: US 7,846,641 B2
(45) Date of Patent: Dec. 7, 2010

(54) GLASS SUBSTRATE HAVING CIRCUIT PATTERN AND PROCESS FOR PRODUCING THE SAME

(75) Inventors: Ryohei Satoh, Osaka (JP); Koji Nakagawa, Osaka (JP); Reo Usui, Osaka (JP); Kenji Tanaka, Tokyo (JP); Satoru Takaki, Tokyo (JP); Kenichi Ebata, Tokyo (JP); Yumiko Aoki, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/143,446

(22) Filed: Jun. 20, 2008

(65) Prior Publication Data

US 2008/0311359 A1    Dec. 18, 2008

Related U.S. Application Data

(63) Continuation of application No. PCT/JP2006/325211, filed on Dec. 18, 2006.

(30) Foreign Application Priority Data

Dec. 20, 2005    (JP)    ............................. 2005-366410

(51) Int. Cl.
    *G03F 7/26*    (2006.01)
(52) U.S. Cl. ...................................... 430/311; 430/330
(58) Field of Classification Search ................ 430/319, 430/311, 320, 321, 330
    See application file for complete search history.

(56) References Cited

U.S. PATENT DOCUMENTS

| 7,060,411 B2 * | 6/2006 | Mitsui et al. ................. 430/198 |
| 2003/0030376 A1 | 2/2003 | Aoki et al. |

FOREIGN PATENT DOCUMENTS

| EP | 1 306 872 A2 | 5/2003 |
| JP | 6-13356 | 1/1994 |
| JP | 10-20509 | 1/1998 |
| JP | 2000-348611 | 12/2000 |
| JP | 2001192238 | * 7/2001 |
| JP | 2002-260562 | 9/2002 |
| JP | 2003-2692 | 1/2003 |
| JP | 2005-108668 | 4/2005 |
| WO | WO 2005/076292 A1 | 8/2005 |

* cited by examiner

*Primary Examiner*—Kathleen Duda
*Assistant Examiner*—Caleen O Sullivan
(74) *Attorney, Agent, or Firm*—Oblon, Spivak, McClelland, Maier & Neustadt, L.L.P.

(57) ABSTRACT

A process for producing a glass substrate having a circuit pattern is disclosed. The process includes forming a thin film layer on a glass substrate and then irradiating the thin film layer with laser light to form a circuit pattern on the glass substrate; depositing a low-melting point glass having a softening point of from 450 to 630° C. on the glass substrate having the circuit pattern formed thereon; and sintering the low-melting point glass to form a low-melting point glass layer which includes the low-melting point glass sintered on the glass substrate having the circuit pattern formed thereon and which forms a compatible layer between the glass substrate and the low-melting point glass layer.

8 Claims, 7 Drawing Sheets

(a)

(b)

(c)

(a)

(b)

(a)

(b)

(c)

(d)

(e)

(f)

(g)

(h)

(i)

(j)

GLASS SUBSTRATE HAVING CIRCUIT PATTERN AND PROCESS FOR PRODUCING THE SAME

TECHNICAL FIELD

The present invention relates to a glass substrate having a circuit pattern and a process for producing the same.

BACKGROUND ART

An electronic circuit board having a circuit pattern comprising a metal or an insulating material in a thin film form on a substrate has hitherto been used for computers, communications, information home appliances, various display devices and the like.

Then, in order to respond to the rapidly developing high-level information society, this electronic circuit board is required to realize higher integration (higher definition) and larger area.

For forming this circuit pattern, there has been generally employed a method using a photolithography etching process. A typical process of this method is illustrated in FIGS. 9 and 10.

Here, FIG. 9 illustrates a part of conventional steps of forming a circuit pattern, in which (a) to (e) are each a cross-sectional view illustrating a diagrammatic configuration of an electronic circuit board; and FIG. 10 illustrates the continuation of the steps of FIG. 9, in which (f) to (j) are each a cross-sectional view illustrating a diagrammatic configuration of an electronic circuit board.

As illustrated in FIGS. 9 and 10, in this method, a thin film for forming a circuit pattern is formed on the entire or partial surface of a substrate, and a resist is then coated and dried to form a resist layer. Then, the resist layer is exposed through a mask and developed, thereby forming a reverse pattern (reverse circuit pattern) to the circuit pattern. Thereafter, a desired circuit pattern is formed through etching and removal of a resist layer. This method is excellent in view of mass productivity because the formation precision of the pattern is good, the same pattern can be reproduced over and over, and plural circuit patterns can be formed on the same substrate.

However, as illustrated in FIGS. 9 and 10, in this method using a photolithography etching process, a number of steps are repeated to complete the circuit pattern. Specifically, in the method as illustrated in FIGS. 9 and 10, after forming a metal thin film 51 on a substrate 50, a resist layer 52 is formed; exposure, development treatment, etching and peeling-off of the resist layer 52 are performed; and furthermore, after forming an insulating layer 53, formation of a resist layer 54, exposure, development, etching and peeling-off of the resist layer 54 are performed.

As described previously, this method requires a very large number of steps including about 22 steps comprising film formation, resist coating, drying, exposure, development, etching, peeling-off of resist layer and the like at every time of forming a circuit pattern comprising a metal thin film and an insulating layer. For that reason, there was involved a problem that the production costs are very high.

Also, in this method, a large amount of a liquid developer, a chemical liquid such as an etching agent and a rinsing liquid are used at every time of the foregoing large number of steps. This involved a problem that not only the yield is low, and the production costs are very high, but environmental loads such as a liquid-waste treatment which has become recently a matter of concern are very large.

Furthermore, etching with an etching agent, etc. was difficult depending upon the kind of a material to be used for a metal oxide film or the like. In consequence, only limited materials having excellent etching properties could be applied in the photolithography etching process.

As conventional methods for coping with these various problems, there is, for example, a patterning method using laser light described in Patent Documents 1 and 2 as shown below.

For the purposes of making a thin film circuit pattern fine and shortening and simplifying a process by surely achieving patterning without using a wet process, Patent Document 1 describes a method for forming a thin film pattern, which is characterized by pattern forming a stencil on the surface of a substrate, subsequently depositing a thin film to be fabricated on the stencil, irradiating energy beams from the back surface side of the substrate and peeling off the stencil, thereby achieving patterning of the thin film.

Also, for the purpose of developing a resist film, peeling off the residual resist and processing a metal thin film, a semiconductor film or an insulating thin film in a completely dry process, Patent Document 2 describes a process for producing a liquid crystal display device, which is characterized by coating a resist film constituted of a polymer material having a urethane bond and/or a urea bond on a glass substrate having a thin film of a metal film, dielectric insulating film or semiconductor film for configuring a liquid crystal display device, or a multilayered film in which a part of the thin film is formed in a pattern form, fabricated thereon; irradiating an excimer laser through a mask having a prescribed opening pattern; removing the resist film in the irradiated portion by an ablation phenomenon to form a resist film pattern in which the thin film is exposed corresponding to the opening pattern of the mask; removing the exposed thin film by the resist pattern through an etching treatment; and then irradiating an excimer laser to remove the residual resist film by an ablation phenomenon.

Now, the patterning method using laser light as in Patent Documents 1 and 2 includes several types. From the viewpoints of environment, costs and the like, a laser patterning method in which laser light is directly irradiated on a thin film formed on a substrate through a photomask, and a part of the thin film is removed to form a pattern on the substrate is preferable. Such a method is also called a direct patterning method.

Furthermore, in this direct patterning method, according to a laser patterning method by stepwise irradiation, it is possible to achieve micro patterning so that a circuit with higher integration (higher definition) can be formed, and a small mask can be used. Therefore, this method is excellent in view of costs and preferable.

The laser patterning method by stepwise irradiation as referred to herein is a sort of the direction patterning method and is a method for irradiating with laser light while moving stepwise a substrate having a thin film formed thereon, thereby achieving laser patterning in a manner the same as in a stepwise exposure method which has hitherto been favorably employed in an exposure step in a circuit pattern forming method.

As conventional methods related to such a laser patterning method by stepwise irradiation, for example, a plasma display panel and a process for producing the same described in Patent Document 3 are exemplified.

Patent Document 3 describes a plasma display panel having a front substrate and a back substrate disposed at prescribed intervals substantially in parallel to the front substrate are provided; plural first electrodes extending in a first direction provided in parallel on the back surface of the front substrate opposing to the back substrate; plural second electrodes extending in a second direction orthogonal to the first direction provided on the front surface of the back substrate opposing to the front substrate; a partition between the adjacent second electrodes to each other; and a fluorescent body between the adjacent second electrodes to each other, wherein the first electrodes are formed by first providing a thin film for the first electrode on the substrate and subsequently irradiating laser beams to be periodically emitted on the thin film continuously in the first direction and at prescribed intervals in the second direction, thereby remaining the thin film between linear laser beam irradiation areas; the laser beams are irradiated such that an arbitrary irradiation area on the thin film to be irradiated with laser beams partly overlaps with a next irradiation area on the thin film to be irradiated with laser beams; and the front substrate and the back substrate are stuck such that when the plasma display panel is viewed from its front, this overlap part between the irradiation areas comes into line with the partition, and a process for producing the same.

When a circuit pattern is formed on a glass substrate by the laser patterning method by stepwise irradiation as described in Patent Document 3 in place of the foregoing photolithography etching process, there may be the case where an overlap portion existing on the glass substrate and doubly irradiated with laser light of the stepwise irradiation causes denaturation to become defective, or the case where it becomes defective due to redeposition of a substance vaporized by laser irradiation light or the like. Such a laser irradiation defect reduces the quality of the glass substrate having a circuit pattern. For example, when this is used as a glass substrate for plasma display, a visible light transmittance of the laser irradiation defective portion differs from that in other portions, thereby adversely influencing the display of a screen.

Patent Document 1: JP-A-6-13356
Patent Document 2: JP-A-10-20509
Patent Document 3: JP-A-2000-348611

DISCLOSURE OF THE INVENTION

Problems to be Solved by the Invention

As to the method of Patent Document 3, it is described that such an adverse influence of the laser irradiation defect is covered by sticking the front substrate and the back substrate such that the overlap part of the irradiation areas with laser beams (laser irradiation defective portion) comes into line with the partition. However, there is involved a problem that when the laser irradiation defective portion is made to come into line with the partition part, a degree of freedom of the design or a degree of freedom for enhancing the productivity is restricted. For example, there is a problem that even when it is intended to process a large processing area where laser processing can be achieved for the purpose of enhancing a processing rate of laser, an optimal design cannot be achieved.

In consequence, inclusive of these problems, it is desirable to provide a glass substrate having a circuit pattern which is free from a laser irradiation defect or even when used for a display device, does not become defective in display. However, a laser defect-free glass substrate does not exist in rules and principles.

An object of the invention is to solve the foregoing problems in the lithography etching process and to provide a glass substrate having a circuit pattern which is free from a laser irradiation defect or even when used for a display device, does not become defective in display and a process for producing the same.

Means for Solving the Problems

In order to achieve the foregoing object, the present inventors made extensive and intensive investigations. As a result, it has been found that by depositing a certain specified low-melting point glass on a glass substrate having a circuit pattern formed by laser irradiation and sintering it, a laser irradiation defect formed on the glass substrate by laser irradiation can be dissipated, or when used for a display device, it does not become defective in display.

Specifically, the invention provides the following (1) to (14).

(1) A process for producing a glass substrate having a circuit pattern, which includes a circuit pattern formation step of forming a thin film layer on a glass substrate and then irradiating the thin film layer with laser light to form a circuit pattern on the glass substrate; a low-melting point glass deposition step of depositing a low-melting point glass having a softening point of from 450 to 630° C. on the glass substrate having the circuit pattern formed thereon; and a sintering step of sintering the low-melting point glass to form a low-melting point glass layer comprising the low-melting point glass sintered on the glass substrate having the circuit pattern formed thereon and to form a compatible layer between the glass substrate and the low-melting point glass layer.

(2) The process for producing a glass substrate having a circuit pattern as set forth above in (1), wherein the compatible layer has a thickness of from 0.7 to 20 times the thickness of a laser irradiation defect formed on the glass substrate upon irradiation of laser light.

(3) The process for producing a glass substrate having a circuit pattern as set forth above in (1), wherein the compatible layer has a thickness equal to or more than the thickness of a laser irradiation defect formed on the glass substrate upon irradiation of laser light.

(4) The process for producing a glass substrate having a circuit pattern as set forth above in any one of (1) to (3), wherein the thin film layer has a layer comprising at least one member selected from the group consisting of metal oxides and metals.

(5) The process for producing a glass substrate having a circuit pattern as set forth above in (4), wherein the thin film layer contains 80% by mass or more of tin oxide.

(6) The process for producing a glass substrate having a circuit pattern as set forth above in any one of (1) to (5), which does not have a laser irradiation defect which becomes defective in display.

(7) A glass substrate having a circuit pattern, which includes a glass substrate having thereon a circuit pattern obtained by irradiating a thin film layer formed on the glass substrate with laser light; a low-melting point glass layer obtained by depositing a low-melting point glass having a softening point of from 450 to 630° C. on the glass substrate having the circuit pattern formed thereon; and a compatible layer between the glass substrate and the low-melting point glass layer.

(8) The glass substrate having a circuit pattern as set forth above in (7), wherein the low-melting point glass has an average coefficient of linear expansion at from 50 to 350° C. of from $60 \times 10^{-7}$ to $100 \times 10^{-7}$/° C.

(9) The glass substrate having a circuit pattern as set forth above in (7) or (8), wherein the compatible layer is one obtained by depositing the low-melting point glass on the glass substrate and then sintering the low-melting point glass at a temperature ranging from a temperature of 50° C. lower than a softening point of the low-melting point glass to a temperature of 150° C. higher than the softening point.

(10) The glass substrate having a circuit pattern as set forth above in any one of (7) to (9), wherein the compatible layer has a thickness of from 0.7 to 20 times the thickness of a laser irradiation defect formed on the glass substrate upon irradiation of laser light.

(11) The glass substrate having a circuit pattern as set forth above in any one of (7) to (10), wherein the thin film layer has a layer comprising at least one member selected from the group consisting of metal oxides and metals.

(12) The glass substrate having a circuit pattern as set forth above in (11), wherein the thin film layer contains 80% by mass or more of tin oxide.

(13) The glass substrate having a circuit pattern as set forth above in any one of (7) to (12), having a visible light transmittance of 60% or more against visible light incoming from side of a first principal surface having the circuit pattern and transmitting into the side of a second principal surface (on the opposite side to the first principal surface).

(14) A plasma display panel including the glass substrate having a circuit pattern as set forth above in any one of (7) to (13).

ADVANTAGE OF THE INVENTION

According to the invention, a laser irradiation defect formed by laser patterning such as stepwise irradiation can be dissipated by a simple method, and as a result, a glass substrate having a circuit pattern which is free from a laser irradiation defect can be provided. Also, a reduction or scattering of visible light transmittance of the glass substrate having a circuit pattern, an increase of strain stress and the like are not generated.

Also, it is possible to achieve micro patterning so that a circuit with higher integration (higher definition) can be formed, and a small mask can be used. Therefore, the invention is excellent in view of costs and is able to suppress the production costs through minimization of the number of steps. Also, a large amount of a liquid developer, a chemical liquid such as an etching agent and a rinsing liquid are not used; and the production costs and environmental loads can be suppressed; and patterning using a material which has hitherto been hardly applied for etching with an etching agent or the like can be achieved. Furthermore, it is possible to provide a process for producing a glass substrate having a circuit pattern which is free from the generation of a laser irradiation defect.

DESCRIPTION OF REFERENCE NUMERALS

Figure 1:
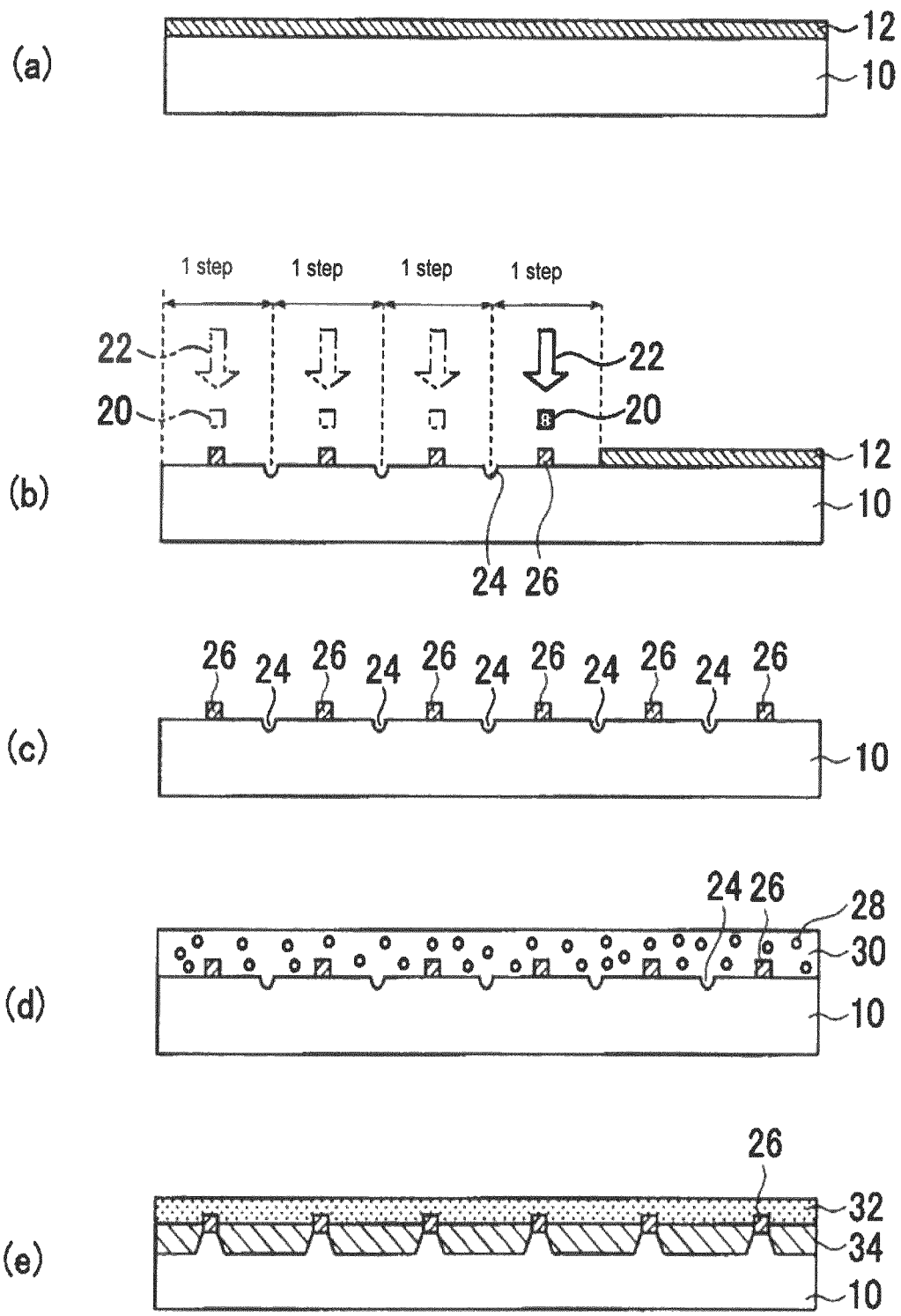
FIG. 1 are diagrammatic cross-section views of a glass substrate having a circuit pattern for explaining the production process of the invention ((a) to (e)).

10: Glass substrate
12: Thin film layer
20: Mask
22: Laser light
24: Laser irradiation defect
26: Circuit pattern
28: Low-melting point glass
30: Organic solvent
32: Low-melting point glass layer
34: Compatible layer
40: Thin film-provided substrate
41: Cell block
43: Reduction projection lens
44: Opening
45: Mask pattern
47: Laser light
48: Laser light source
49: Mask pattern
50: Substrate
51: Metal thin film
52: Resist layer
53: Insulating layer
54: Resist layer

BEST MODE FOR CARRYING OUT THE INVENTION

The invention is concerned with a process for producing a glass substrate having a circuit pattern, which includes a circuit pattern formation step of forming a thin film layer on a glass substrate and then irradiating the thin film layer with laser light to form a circuit pattern on the glass substrate; a low-melting point glass deposition step of depositing a low-melting point glass having a softening point of from 450 to 630° C. on the glass substrate having the circuit pattern formed thereon; and a sintering step of sintering the low-melting point glass to form a low-melting point glass layer comprising the low-melting point glass sintered on the glass substrate having the circuit pattern formed thereon and to form a compatible layer between the glass substrate and the low-melting point glass layer.

Such a production process is also hereinafter referred to as "production process of the invention".

Also, the invention is concerned with a glass substrate having a circuit pattern, which includes a glass substrate having thereon a circuit pattern obtained by irradiating a thin film layer formed on the glass substrate with laser light; a low-melting point glass layer obtained by depositing a low-melting point glass having a softening point of from 450 to 630° C. on the glass substrate having the circuit pattern formed thereon; and a compatible layer between the glass substrate and the low-melting point glass layer.

Such a glass pattern having a circuit pattern is also hereinafter referred to as "glass substrate of the invention".

First of all, the production process of the invention is described with reference to FIGS. 1 to 7.

The production process of the invention includes a circuit pattern formation step, a low-melting point glass deposition step and a sintering step.

<Circuit Pattern Formation Step>

In the circuit pattern formation step to be included in the production process of the invention, a thin film layer 12 is first formed on a glass substrate 10 (FIG. 1(a)). Next, laser light is irradiated on this thin film layer.

In the circuit pattern formation step to be included in the production process of the invention, the method for forming the thin film layer 12 on the glass substrate 10 is not particularly limited but can be carried out by a usual method.

For example, a sputtering or vapor deposition method can be applied.

In the case where the thin film layer 12 comprising a metal oxide is formed by sputtering, the sputtering may be carried out in an inert atmosphere of argon or the like using a metal oxide as described later as a target. Also, when the sputtering is carried out in an atmosphere containing oxygen using a metal as a target, the thin film layer 12 comprising an oxide of the subject metal can be formed. Also, in the case where the thin film layer 12 comprising a metal is formed by sputtering, the sputtering may be carried out in an inert atmosphere of argon or the like using a metal as a target. Here, the sputtering can be carried out within a usual range of the reaction condition regarding substrate temperature, pressure of a sputtering gas, sputtering time, etc.

In the case of achieving the circuit pattern formation by other method such as a vapor deposition method, it can be carried out under a usual fabrication condition, etc.

Also, such a glass substrate having the thin film layer formed on the surface thereof is also hereinafter referred to as "thin film-provided substrate".

Figure 4:
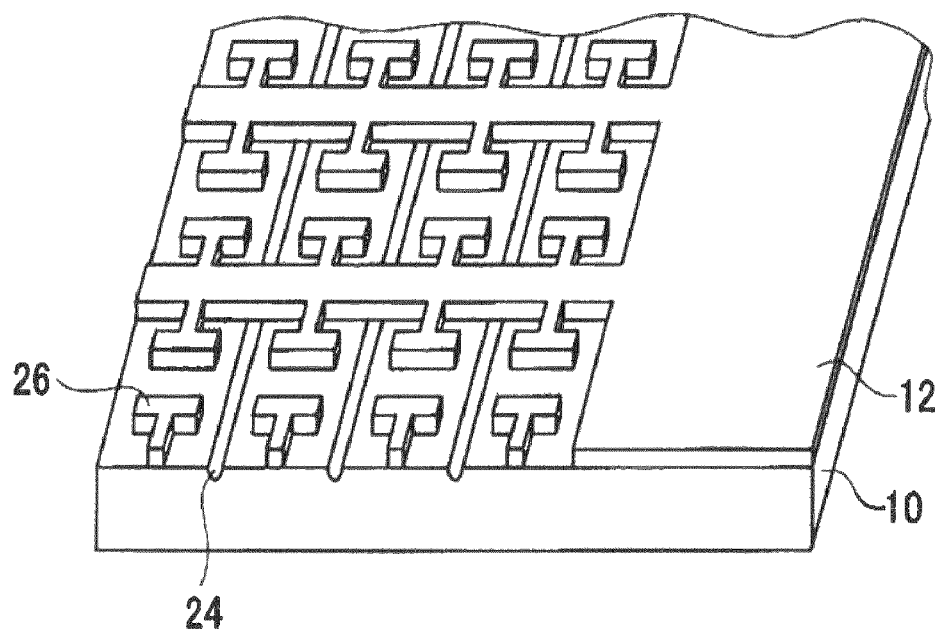
FIG. 4 is a perspective view of the diagrammatic cross-sectional view of FIG. 1(b).

In the circuit pattern formation step to be included in the production process of the invention, the thin film layer 12 is first formed on the glass substrate 10 by the foregoing method; and laser light 22 is subsequently irradiated on this thin film 12 through a mask 20 to form a circuit pattern 26 having the thin film layer patterned on the glass substrate 10 (FIGS. 1(b) to 1(c) and FIG. 4). The laser irradiation is preferably stepwise irradiation, and the laser irradiation is hereinafter defined to refer to stepwise irradiation. The range of laser light to be irradiated by one-time stepwise irradiation was illustrated as "one step" in FIG. 1(b). Also, FIG. 4 is a perspective view of FIG. 1(b).

This stepwise irradiation of laser light is a method for irradiating with laser light while moving stepwise (minutely at the same intervals) a thin film-provided substrate in a manner the same as in a stepwise exposure method which has hitherto been favorably employed in an exposure step in a circuit pattern formation method.

For example, in the case where plural places to be irradiated with laser exist in a matrix form in both the X direction and the Y direction on the upper surface of a single thin film-provided substrate, laser light is irradiated on one place to be irradiated with laser through a mask pattern; the thin film-provided substrate is then relatively moved (moved stepwise) relative to the irradiation position of laser light; a next laser irradiation place is aligned at the laser irradiation position; and laser irradiation is successively achieved.

This is described with reference to a specific example of FIG. 2.

It is supposed that a place to be irradiated with laser of 1,500 μm×1,200 μm as illustrated in FIG. 2(a) exists on a thin film-provided substrate. Also, it is supposed that an area where laser light can be irradiated by one-time laser irradiation is 505 μm×205 μm as illustrated in FIG. 2(c). The area where laser light can be irradiated by one-time laser irradiation is also hereinafter referred to "cell block".

First of all, laser light is irradiated on a No. 1 area in FIG. 2(a) (referred to as "cell block 1", hereinafter the same for Nos. 2 to 18 areas) through a mask pattern. The thin film-provided substrate is then relatively moved (moved stepwise) relative to the irradiation position of laser light, and laser light is irradiated on a cell block 2. Thereafter, the stepwise movement and the irradiation of laser light are repeated, thereby irradiating up to a cell block 18 with laser light.

Here, in the case where laser light is irradiated on the cell block 2, the laser light is irradiated in such a manner that the cell block 2 slightly overlaps the cell block 1. Similarly, in the case where laser light is irradiated on a certain cell block, the laser light is irradiated in such a manner that this cell block slightly overlaps a cell block irradiated with laser light just before it.

This is carried out for the purpose of compensating a movement precision error of an apparatus for executing the stepwise movement or the like, and in general, laser light is irradiated so as to provide an overlap width of about 5 μm.

In consequence, in such stepwise irradiation of laser light, a portion corresponding to a boundary line between the adjacent cell blocks to each other (overlap portion having a width of about 5 μm) is twice irradiated with laser light. Then, in this overlap portion on the glass substrate, a laser irradiation defect 24 can be formed (FIGS. 1(b) and 1(c) and FIG. 4).

In the circuit pattern formation step to be included in the production process of the invention, these methods can be applied in the method of stepwise irradiation of laser light. But, it should not be construed that the invention is limited thereto.

Figure 2:
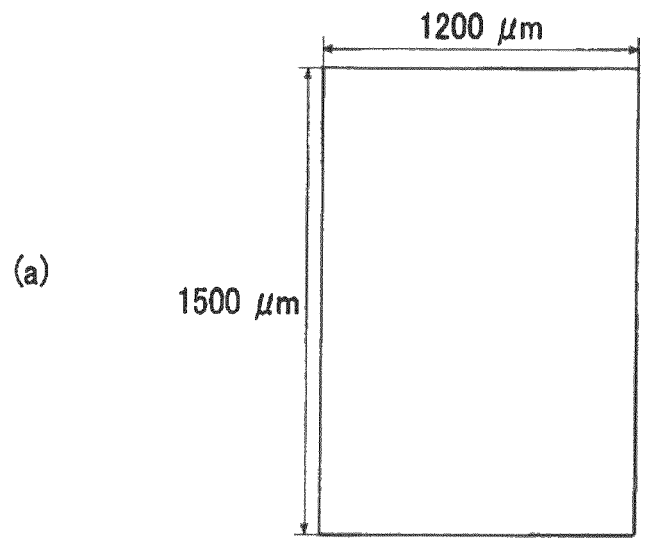
FIG. 2 are views for explaining the stepwise movement in stepwise exposure of laser light according to the production process of the invention.
Figure 2:
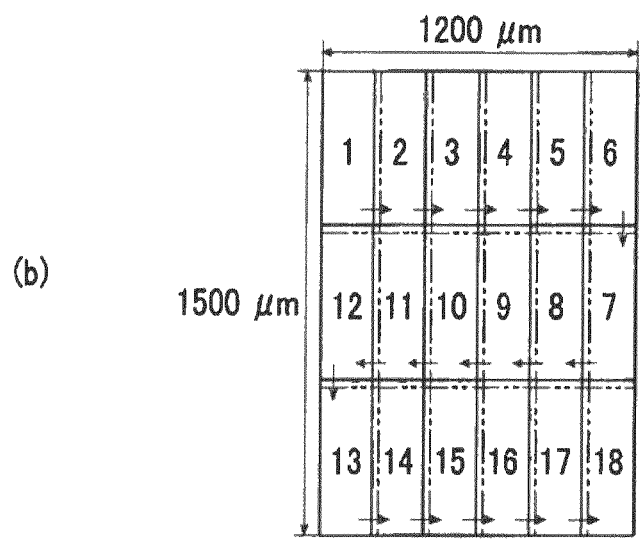
Figure 2:
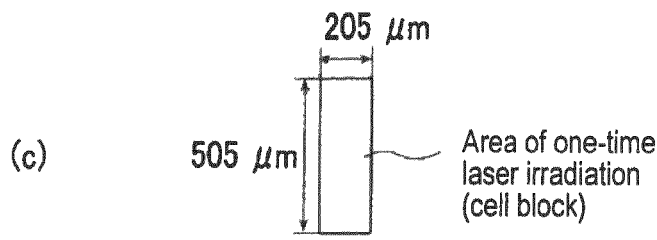

Also, the laser light to be irradiated in the specific example as illustrated in this FIG. 2 is one obtained by adjusting laser light such as excimer laser light and YAG laser light so as to have a rectangular shape as in FIG. 2 (c) and have uniform energy distribution on the laser irradiation surface (cell block) by a homogenizer or the like. Similar laser light which is, however, adjusted so as to have a shape other than the rectangle may be irradiated.

Also, the one-time laser irradiation as referred to herein means irradiation of laser light of 1 pulse or several pulses. The pulse number may be one in an extent that the thin film layer can be removed from the glass substrate and that a great defect (specifically, a damage defect, a defect due to flying residues of the thin film layer or a redeposition defect due to redeposition after flying of a part of the thin film layer) is not brought. If the defect is just a little bit, it can be removed through the formation of a low-melting point glass layer (formation of a compatible layer) in the later sintering step.

As the laser light, for example, one having a wavelength of from 248 to 1,600 nm and an energy density of from 1 to 50 J/cm$^2$ can be used. This wavelength is preferably from 532 nm (second harmonic of YAG laser) to 1,064 nm (fundamental wave of YAG laser), and more preferably 1,064 nm (fundamental wave of YAG laser). Also, this energy density is preferably from 2 to 30 J/cm$^2$, and more preferably from 5 to 30 J/cm$^2$.

What the wavelength and energy density of the laser light fall within such ranges is preferable because the thin film layer can be substantially completely removed from the glass substrate.

Figure 7:
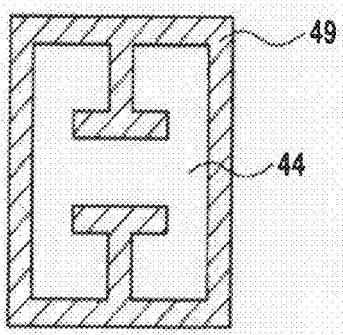
FIG. 7 is a view illustrating the shape of a mask pattern used in the Examples.

Also, the mask pattern to be used has a desired opening, and for example, a mask pattern 49 having an opening 44 as illustrated in FIG. 7 as described later can be used.

The quality, thickness, shape and the like of the mask pattern are not particularly limited, and any material may be used so far as it has a quality, a thickness and the like such that it does not transmit the laser light to be irradiated therethrough and is not worn out by the laser light.

In the circuit pattern formation step to be included in the production process of the invention, as an apparatus for exposing stepwise laser light to form a circuit pattern on the glass substrate, for example, an apparatus as illustrated in the following FIG. 3 can be applied.

Figure 3:
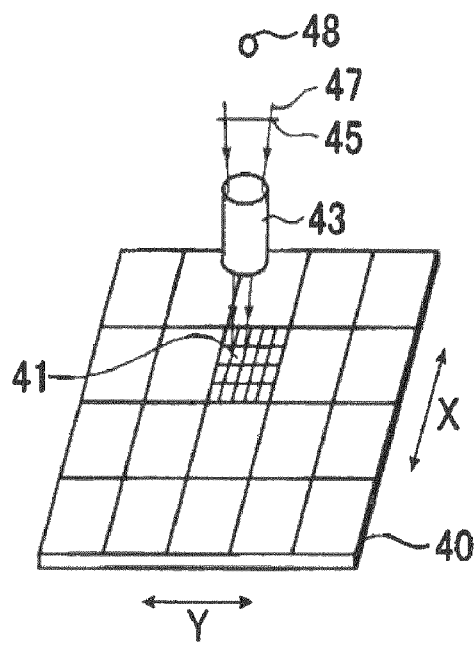
FIG. 3 is a diagrammatic view illustrating a preferred embodiment for achieving stepwise irradiation of laser light according to the production process of the invention.

In FIG. 3, 40 stands for a thin film-provided substrate, and plural places to be irradiated with laser exist in this thin film-provided substrate 40. The laser irradiation place is an aggregate of cell blocks 41.

The thin film-provided substrate 40 is placed on a stage (not illustrated) configuring a stepper system (system for achieving the stepwise movement), and the thin film-provided substrate 40 can be moved stepwise in both the X direction and the Y direction by this stage.

Also, an optical system of the stepper system is provided above the thin film-provided substrate 40; and in FIG. 3, 48 stands for a laser light source thereof. Laser light 47 which has come out from this laser light source 48 passes through a homogenizer (not illustrated) and then passes through a mask pattern 45 and is subsequently irradiated on the cell blocks 41 through a reduction projection lens 43. In this way, a fine pattern of the mask pattern 45 is repeatedly irradiated on the cell blocks 41, thereby forming a circuit pattern.

<Low-Melting Point Glass Deposition Step>

In the low-melting point glass deposition step to be included in the production process of the invention, a low-melting point glass 28 is deposited on the glass substrate 10 on which the circuit pattern 26 has been formed in the foregoing method.

Properties, etc. of the low-melting point glass are described later.

Here, this low-melting point glass 28 is deposited on the circuit pattern 26 and the substrate surface of the glass substrate 10 exposed between the circuit patterns. In the case where the glass substrate having a circuit pattern obtained by the production process of the invention is, for example, used as a glass substrate of a panel for plasma display, the low-melting point glass 28 may be deposited at least in an effective portion which is considered to be a display part of the glass substrate 10. Even this case falls within the scope of the invention.

In the low-melting point glass deposition step to be included in the production process of the invention, a method for depositing the low-melting point glass 28 on the glass substrate 10 having the circuit pattern 26 formed thereon is not particularly limited but can be carried out by a usual method.

For example, there is exemplified a method in which the low-melting point glass 28 in a powdered form (mass average particle size is from about 0.5 to 4 μm) is contained in an organic solvent 30 containing cellulose, etc. to prepare a pasty ink, and screen printing is performed using this (FIG. 1(*d*)).

Besides, there can be exemplified different coating methods using a die coater, a bar coater or the like and a method for sticking it in a sheet-like form.

The deposition amount of this low-melting point glass 28 is not particularly limited but may be properly chosen depending upon the thickness of a low-melting point glass layer to be formed. For example, by depositing it in an amount of from about 50 to 200 g/m$^2$ relative to a unit area of the glass substrate, the low-melting point glass layer can be formed. The thickness of the low-melting point glass layer is preferably from 10 to 60 μm.

<Sintering Step>

In the sintering step to be included in the production process of the invention, the glass substrate 10 on which the low-melting point glass 28 has been deposited by the foregoing method is preferably heated in the atmosphere, thereby sintering the low-melting point glass. The sintering temperature is preferably a temperature ranging from a temperature of 50° C. lower than a softening point of the low-melting point glass to a temperature of 150° C. higher than the softening point.

Here, a sintering measure is not particularly limited but may be one in which the glass substrate 10 having the low-melting point glass 28 deposited thereon can be sintered in the atmosphere at a prescribed sintering temperature for a prescribed sintering time. For example, the sintering can be carried out using an electric furnace.

Also, the sintering time is not particularly limited. For example, a sintering time of from about 10 to 60 minutes can be exemplified.

Specifically, there is exemplified a method in which the temperature is raised to the foregoing sintering temperature under a temperature rise condition of from 3 to 20° C./min, and after keeping for from about 10 to 60 minutes, the resulting glass substrate is gradually cooled by allowing it to stand within a sintering furnace.

Also, the sintering temperature is preferably a temperature ranging from a temperature of 50° C. lower than a softening point of the low-melting point glass 28 to a temperature of 150° C. higher than the softening point, more preferably a temperature of from 60 to 140° C. higher than a softening point of the low-melting point glass 28, and most preferably a temperature of from 90 to 130° C. higher than a softening point of the low-melting point glass 28. By achieving the sintering at such a temperature, a low-melting point glass layer 32 comprising the low-melting point glass 28 can be formed on the glass substrate 10 and the circuit pattern 26. Furthermore, a compatible layer 34 can be formed between the glass substrate 10 and the low-melting point glass layer 32 (FIG. 1(*e*)).

Figure 5:
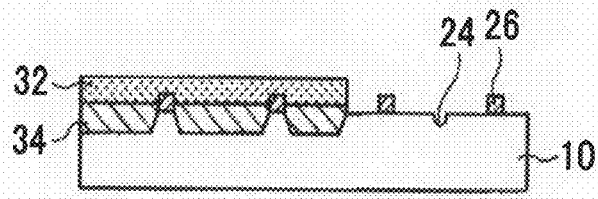
FIG. 5 is a diagrammatic cross-sectional view of a glass substrate having a circuit pattern for explaining the glass substrate of the invention.

Here, FIG. 5 is a cross-sectional view in which the low-melting point glass layer 32 is formed on a part of the upper surface of the glass substrate 10 having the circuit pattern 26. Also, FIG. 6 is a photograph taken from the top surface side of one as illustrated in FIG. 5.

Figure 6:
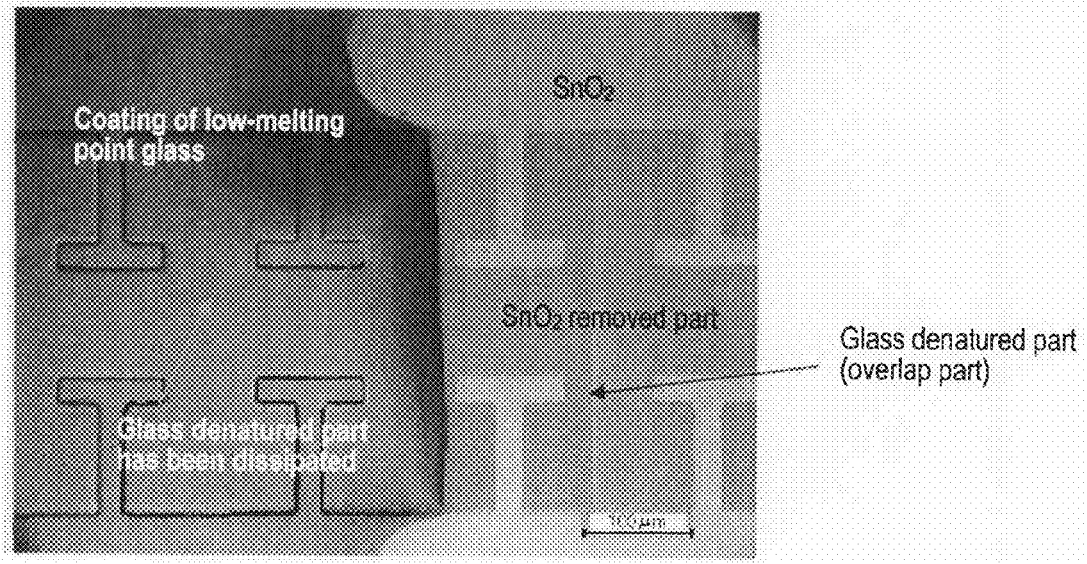
FIG. 6 is a top surface photograph (microscopic photograph) of a glass substrate having a circuit pattern for explaining the glass substrate of the invention.

In this way, the compatible layer 34 is formed in a portion where the glass substrate 10 and the low-melting point glass layer 32 come into contact with each other (see FIGS. 5 and 6).

The thickness of this compatible layer is described later. In FIGS. 5 and 6, since the thickness of this compatible layer 34 is thicker than the thickness of the laser irradiation defect 24, the laser irradiation defect 24 is completely dissipated. Also, in case of using this glass substrate for a display device, even in the case where the thickness of the laser defect is thicker than the thickness of the compatible layer, when the thickness of the compatible layer is at least 0.7 times the thickness of the laser defect, the laser defect is not viewed as a display defect, and such is effective, too in this case.

Here, when the sintering temperature is too low, there is a possibility that the thickness of the compatible layer 34 is thin so that the thickness of the laser irradiation defect is not dissipated. Conversely, when the sintering temperature is too high, there is a possibility that a crack appears in the thin film layer 12.

According to such a production process of the invention, the glass substrate of the invention can be produced.

The glass substrate of the invention is described with reference to FIG. 1(e).

The glass substrate of the invention has the circuit pattern 26 on the glass substrate 10. This circuit pattern 26 is a circuit pattern obtained by irradiating stepwise laser light on the thin film layer 12 formed on this glass substrate 10. Also, the glass substrate of the invention has the low-melting point glass layer 32 comprising a low-melting point glass having a softening point of from 450 to 630° C. on this circuit pattern 26 and the glass substrate 10. Here, though this low-melting point glass layer 32 usually exists on the circuit pattern 26 and the glass substrate 10, the low-melting point glass layer 32 may at least come into contact with at least a part of the glass substrate 10. Even this case falls within the scope of the invention. Furthermore, the glass substrate of the invention has the compatible layer 34 between the glass substrate 10 and the low-melting point glass layer 32.

In the production process of the invention and the glass substrate of the invention (hereinafter also simply referred to as "the invention"), the glass substrate is not particularly limited but is arbitrary as to composition, thickness, size, etc. so far as it has a softening point higher than a softening point of the low-melting point glass as described later. For example, a glass substrate having a softening point of from 700 to 900° C. can be preferably used. Also, for example, a glass substrate having an average coefficient of linear expansion at from 50 to 350° C. of from $60 \times 10^{-7}$ to $100 \times 10^{-7}/°$ C. can be preferably used. Also, for example, a glass substrate having a thickness of from about 1.5 to 3 mm, which has hitherto been used as a glass substrate for plasma display panel (PDP), can be preferably used.

Also, in the invention, it is preferable that the thin film layer has a layer comprising at least one member selected from the group consisting of metal oxides and metals.

So far as the metal oxide is concerned, for example, one containing tin oxide as a major component or one containing indium oxide as a major component is preferable. The foregoing tin oxide or indium oxide may contain other metals. For example, it is possible to add tin in an amount of from 3 to 15% by mass of the whole in indium oxide. Of these, tin oxide containing at least one member selected from the group consisting of antimony, tantalum and niobium is especially preferable in view of low resistivity.

Also, in the invention, it is preferable that the thin film layer contains 80% by mass or more of tin oxide. The reasons for this reside in the points of high resistance to the low-melting point glass capable of forming a layer on this thin film layer and easiness for achieving the laser patterning.

In the invention, it is preferable that the thin film layer contains a metal, and Cr, Cu, Ti, Ni, etc. can be preferably used in view of low resistivity.

Also, this thin film layer is one containing such a metal oxide or metal as a major component, and a small amount of components other than the metal oxide or metal may be contained therein. The "small amount" as referred to herein means an amount to an extent that a function of the circuit pattern to be formed by irradiating the thin film layer with laser light (for example, a function as an electrode when this pattern is used as the electrode) is not hindered.

Also, though the thickness (average thickness) of this thin film layer is not particularly limited, in the case where the material of the thin film layer is a metal oxide film, it is preferably from 100 to 1,000 nm, more preferably from 100 to 400 nm, and most preferably from 200 to 350 nm. Such a range is preferable because desired resistivity value and transmittance are obtainable at the same time. In the case where the material of the thin film layer is a metal film layer, the thickness is preferably from 500 to 5,000 nm. This thickness can be adjusted by controlling the fabrication time, etc. in the foregoing sputtering or vapor deposition method or the like.

The thickness of the thin film layer as referred to in the invention means an average film thickness as measured by a stylus type profilometer.

Also, in the invention, the low-melting point glass has a softening point of from 450 to 630° C.

This softening point is preferably from 460 to 540° C., and further preferably from 470 to 510° C. When the softening point falls within the range of from 450 to 630° C., a difference width from the softening point of the glass substrate is large. Therefore, in the sintering step, only this low-melting point glass can be sintered without deforming the glass substrate, and the compatible layer with the glass substrate can be formed. Also, in the case where the glass substrate of the invention is applied to a plasma display panel, the surroundings of the glass substrate of the invention are heat sealed. When the softening point of the low-melting point glass is too low, the low-melting point glass is softened at this sealing temperature (about 400° C.). However, when the softening point falls within the foregoing range, the low-melting point glass is not softened at the sealing temperature, and sealing can be achieved.

Here, the softening point was measured in the range of from room temperature to 800° C. at a temperature rise rate of 10° C./min by differential thermal analysis using a glass powder as a sample and an alumina powder as a standard sample. In the invention, all the softening points are a value as measured by this method.

Also, this low-melting point glass preferably has an average coefficient of linear expansion at from 50 to 350° C. of from $60 \times 10^{-7}$ to $100 \times 10^{-7}/°$ C., more preferably from $65 \times 10^{-7}$ to $90 \times 10^{-7}/°$ C., and most preferably from $70 \times 10^{-7}$ to $85 \times 10^{-7}/°$ C. When the average coefficient of linear expansion falls within such a range, this average coefficient of linear expansion is the same degree to an average coefficient of linear expansion of a usually used glass substrate. Therefore, there are brought such effects that a crack, etc, is hardly generated in the low-melting point glass layer comprising this low-melting point glass and that a warp of the glass substrate or a reduction of the strength can be prevented from occurring.

Here, the average coefficient of linear expansion is a value obtained by measuring a sample prepared by first flowing out a molten glass onto a stainless steel-made plate, gradually cooling it at a temperature in the vicinity of a glass transition point and then processing the gradually cooled glass into a columnar form having a diameter of 2 mm and a length of 20 mm over the range of from 50 to 350° C. at a temperature rise rate of 10° C./min by a differential dilatometer while using a quartz glass as a standard sample. In the invention, all the average coefficients of linear expansion are a value as measured by this method.

As the low-melting point glass which can be used in the invention, a composition substantially composed of from 1 to 55% by mole of $SiO_2$, from 5 to 60% by mole of $B_2O_3$, from 0 to 70% by mole of ($PbO+Bi_2O_3$), from 0 to 30% by mole of ZnO, from 0 to 10% by mole of $Al_2O_3$, from 0 to 15% by mole of (MgO+CaO), from 0 to 15% by mole of (SrO+BaO), from 0 to 15% by mole of ($Li_2O+Na_2O+K_2O$) and from 0 to 2% by mole of ($CuO+CeO_2+SnO_2$) in terms of % by mole on the basis of oxides can be exemplified.

More preferably, a composition substantially composed of from 2 to 15% by mole of $SiO_2$, from 35 to 45% by mole of $B_2O_3$, from 25 to 45% by mole of ($PbO+Bi_2O_3$), from 5 to 15% by mole of ZnO and from 0.1 to 1% by mole of ($CuO+CeO_2+SnO_2$) in terms of % by mole on the basis of oxides can be exemplified.

Also, in the invention, the compatible layer exists between the glass substrate and the low-melting point glass layer. This compatible layer can be obtained by depositing the low-melting point glass on the glass substrate and then sintering this low-melting point glass. This compatible layer is a layer in which the material of the glass substrate and the material of the low-melting point glass are mutually diffused.

It is preferable that the compatible layer in the invention is obtained by depositing the low-melting point glass on the glass substrate and then sintering the low-melting point glass by heating at a temperature ranging from a temperature of 50° C. lower than the softening point of the low-melting point glass to a temperature of 150° C. higher than the softening point. The reasons for this reside in the points that by thoroughly melting the low-melting point glass at a sufficiently high temperature, the compatibility with the glass substrate can be enhanced; and further that by adjusting the sintering temperature, the thickness of the compatible layer can be arbitrarily adjusted, and the thickness of the compatible layer can be adjusted at a preferred value depending upon the thickness of a formed laser irradiation defect.

Also, the thickness of this compatible layer is preferably from 0.7 to 20 times the thickness of the laser irradiation defect formed on the glass substrate upon stepwise irradiation of laser light. The thickness of this compatible layer is more preferably thicker than the thickness of the laser irradiation defect, namely at least 1.0 time, further preferably from 1.5 to 3 times, and most preferably about 2 times the thickness of the laser irradiation defect. In that case, the laser irradiation defect on the surface of the glass substrate can be dissipated. In the case where the thickness of the compatible layer is 0.7 times or more and less than 1.0 time, though the laser irradiation defect slightly remains, its residual amount is low. Therefore, at the time of using the produced glass substrate having a circuit pattern, a problem such as a reduction or scattering of visible light transmittance is not substantially caused, whereby it is not viewed as a display defect.

This laser irradiation defect is just like a scratch generated in the overlap portion (on the glass substrate) in the stepwise irradiation of laser light (see FIG. 6).

Though the depth of this laser irradiation defect is not fixed, it is generally from about 0.1 to 1.0 μm.

In consequence, the thickness of the compatible layer is preferably from 0.07 to 10 μm, more preferably from 0.1 to 5 μm, and most preferably from 0.1 to 4 μm. When the thickness of the compatible layer is too thin as compared with such a range, the laser irradiation defect is not dissipated, whereas when it is too thick as compared with such a range, there is a possibility that a problem is caused in performance of frit or the like. In consequence, the compatible layer is preferably one having a thickness falling within such a range.

Furthermore, by forming such a compatible layer, it is possible to exhibit an effect that the evaporation leaving by laser or a defect due to redeposition of an evaporated material can be eliminated.

This thickness of the laser irradiation defect is one measured through electron microscopic observation of a cross-section of the compatible layer. Though the thickness of the compatible layer is not always uniform, the thickness of the compatible layer as referred to in the invention means an average thickness.

Such a thickness of the compatible layer can be adjusted by varying some parameters in the sintering step. However, major parameters are two of the sintering temperature and the softening point of the low-melting point glass. By adjusting these two parameters, it is possible to adjust the thickness of the compatible layer.

For example, when a low-melting point glass having a softening point of 480° C. is deposited on a glass substrate and sintered at 600° C., a compatible layer having a thickness of about 3.5 μm can be formed.

Also, for example, when a low-melting point glass having a softening point of 620° C. is deposited on a glass substrate and sintered at 600° C., a compatible layer having a thickness of about 0.15 μm can be formed.

In the glass substrate having a circuit pattern obtained by the production process of the invention and the glass substrate of the invention, a transmittance against visible light incoming from a first principal surface side having the circuit pattern and transmitting into a second principal surface (JIS R3106 (1998)) is preferably 60% or more, and more preferably 70% or more. The foregoing "second principal surface" as referred to herein means a surface on the opposite side to the "first principal surface".

As to the visible light transmittance, a transmittance at a wavelength of 550 nm was measured using an automatic recording spectrophotometer U-3500 (integrating sphere type), manufactured by Hitachi, Ltd. A glass substrate-free state was defined as 100%. In the invention, all the visible light transmittances are a value as measured by this method.

The glass substrate having a circuit pattern obtained by the production process of the invention and the glass substrate of the invention can be favorably used as a substrate of a flat panel display, especially a plasma display panel (PDP).

That is, in the glass substrate having a circuit pattern obtained by the production process of the invention and the glass substrate of the invention, the thin film layer comprising $SnO_2$ or ITO on the glass substrate works as a display electrode, the low-melting point glass layer works as a dielectric layer, and the whole can work as a front substrate of PDP. As described previously, this PDP has a high visible light transmittance as compared with conventional PDPs and therefore, is favorable.

Also, it may be said that the production process of the invention is a process for producing a glass substrate having a circuit pattern by applying the following pattern formation method to form a circuit pattern on a glass substrate.

That is, the production process of the invention is a pattern formation method in which a thin film layer is formed on a glass substrate, laser light is irradiated stepwise to form a circuit pattern on the glass substrate, and a low-melting point glass having a softening point of from 450 to 630° C. is deposited on the glass substrate having this circuit pattern formed thereon, followed by sintering, preferably sintering at a temperature ranging from a temperature of 50° C. lower than the softening point of the low-melting point glass to a temperature of 150° C. higher than the softening point.

EXAMPLES

Embodiments of the invention will be illustrated in detail with reference to the following Examples, but the invention should not be construed as being limited thereto.

Example 1

A glass substrate (PD200, manufactured by Asahi Glass Co., Ltd.) of 40 mm in square and 2.8 mm in thickness was prepared. This glass substrate has an average coefficient of linear expansion at from 50 to 350° C. (JIS-R3102 (1995)) of $83 \times 10^{-7}/°$ C., a strain point (JIS-R3104 (1995)) of 570° C. and a softening point (JIS-R3103 (1995)) of 830° C.

This glass substrate is also hereinafter referred to as "glass substrate A".

An antimony-doped tin oxide film was formed on one principal surface of this glass substrate A using a sputtering fabrication apparatus.

Specifically, the sputtering fabrication was carried out using, as a target, a sintered body containing 95% by mass of tin oxide and 5% by mass of antimony oxide at an initial degree of vacuum of $1.3 \times 10^{-4}$ Pa, a glass sheet temperature of 250° C. and a degree of vacuum at the time of introduction of an argon/oxygen gas of $6.7 \times 10^{-1}$ Pa (at that time, an oxygen partial pressure was 5%).

As a result, a 300 nm-thick thin film layer (antimony-doped tin oxide film) could be uniformly formed on the glass substrate A. The formed film had a composition the same as in the target.

Such a glass substrate having a thin film layer on the glass substrate A is also hereinafter referred to as "glass substrate A1".

Next, laser light was irradiated stepwise on the glass substrate A1 using a laser light irradiation apparatus (manufactured by Spectron), thereby forming a circuit pattern.

The laser light of this apparatus was YAG laser light (50 Hz) and was set up at a wavelength of 1,064 nm and an energy density of 11 J/cm². This laser light was made to pass through a homogenizer and adjusted so as to have a rectangular shape as illustrated in FIG. 2(c). Then, the laser light was irradiated on the glass substrate A1 through a mask pattern having a pattern (opening) as illustrated in FIG. 7. Then, the laser irradiation portion (corresponding to the foregoing cell block) of the glass substrate was adjusted at 505 μm on the long side and 205 μm on the short side.

Also, the overlap width was set up at 5 μm, the stage was moved so as to be synchronized with the stepwise irradiation, and the stepwise irradiation was performed.

Then, after performing the stepwise irradiation, the surface of the glass substrate A1 having been irradiated stepwise was observed by an electron microscope. As a result, it was confirmed that a laser irradiation defect having a depth of about 0.2 μm existed in the overlap portion.

The thus obtained glass substrate is also hereinafter referred to as "glass substrate A2".

Next, 100 g of a low-melting point glass powder was kneaded with 25 g of an organic vehicle to prepare a glass paste. The organic vehicle is one prepared by dissolving 10% of ethyl cellulose in terms of % by mass in α-terpineol or diethylene glycol monobutyl ether acetate.

Also, this low-melting point glass powder has a mass average particle size of 1 μm.

Furthermore, this low-melting point glass powder has a softening point of 478° C., a glass transition point of 418° C. and an average coefficient of linear expansion at from 50 to 350° C. of from $84 \times 10^{-7}/°$ C. Also, this low-melting point glass contains 12% by mole of $SiO_2$, 40% by mole of $B_2O_3$, 42% by mole of PbO, 6% by mole of ZnO and 0.5% by mole of $SnO_2$ as reduced into oxides.

The measurement methods of characteristics of the low-melting point glass are as follows.

<Mass Average Particle Size>

First of all, the molten glass was poured into a stainless steel-made roller and formed into a flake. Next, the obtained glass flake was dry pulverized in an alumina-made ball mill for 16 hours and subjected to air current classification to prepare a glass powder having a mass average particle size of from 2 to 4 μm.

Then, this glass powder was dispersed in water, and its mass average particle size (unit: μm) was measured using a laser diffraction type particle size distribution analyzer (SALD2100, manufactured by Shimadzu Corporation).

<Average Coefficient of Linear Expansion>

First of all, a part of the obtained molten glass was poured into a stainless steel-made mold and gradually cooled.

Next, the gradually cooled glass was processed into a column having a length of 20 mm and a diameter of 5 mm, and this was used as a sample and measured for an average coefficient of linear expansion (unit: $10^{-7}/°$ C.) at from 50 to 350° C. using a horizontal differential detection mode dilatometer (DILATOMETER TD5000SA-N, manufactured by Bruker AXS K.K.).

<Softening Point and Glass Transition Point>

The glass powder prepared in the foregoing measurement of mass average particle size was used as a sample and measured for a softening point and a glass transition point using a differential thermal analyzer (THERMO PLUS TG8110, manufactured by Rigaku Corporation) in the range of up to 800° C.

Next, this pasty ink was screen printed on the glass substrate A2. Then, after drying at 120° C. for 10 minutes, the thickness of the printed dry film was measured by a stylus type surface roughness meter. As a result, it was confirmed that the pasty ink was coated in a thickness of 45 μm on the glass substrate.

The thus pasty ink-coated glass substrate is also hereinafter referred to as "glass substrate A3".

Next, this glass substrate A3 was charged in an electric furnace and heated. As to the heating condition, the temperature was raised from room temperature to 600° C. at a rate of 10° C./min and kept at 600° C. for 30 minutes. Thereafter, the resulting glass substrate was gradually cooled within the electric furnace.

The thus obtained glass substrate is also hereinafter referred to as "glass substrate A4".

Figure 8:
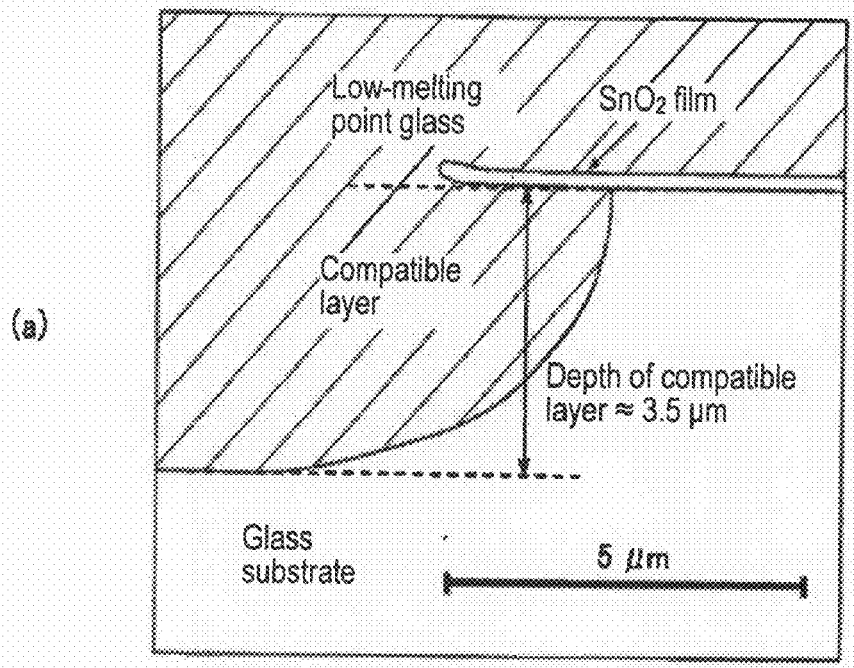
FIG. 8 are explanatory views of a cross-section of the glass substrate of the invention obtained in Example 1.
Figure 8:
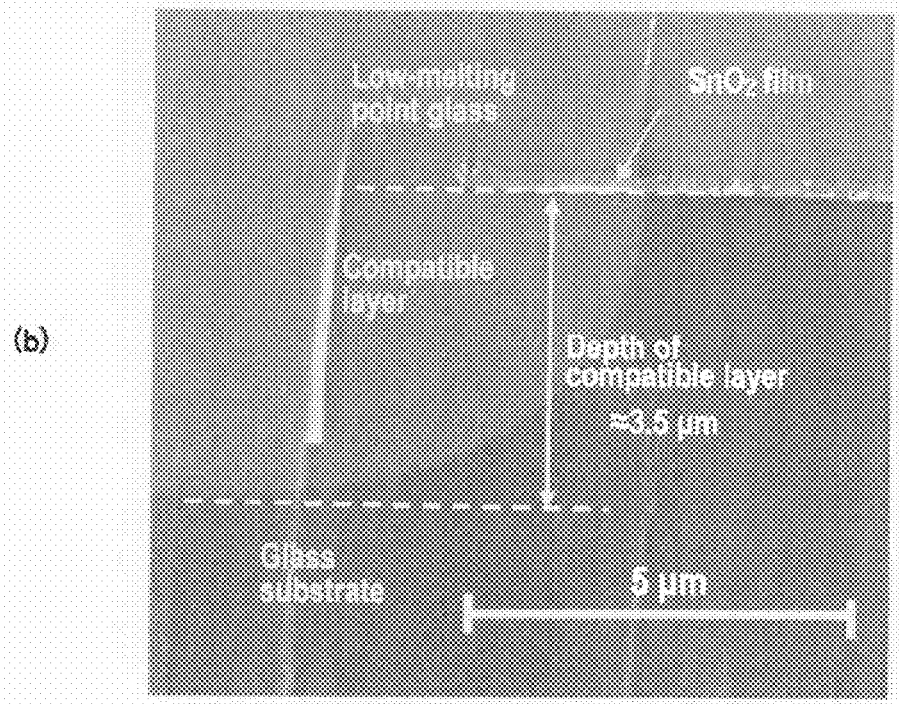
Figure 9:
FIG. 9 are diagrammatic cross-sectional views of a glass substrate having an electronic circuit for explaining a conventional circuit pattern formation method ((a) to (e)).
Figure 9:
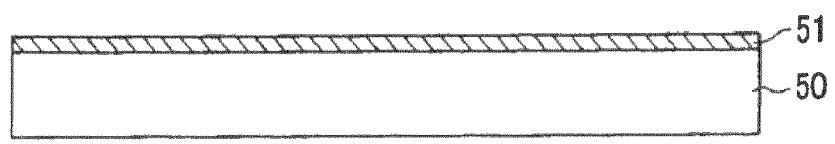
Figure 9:
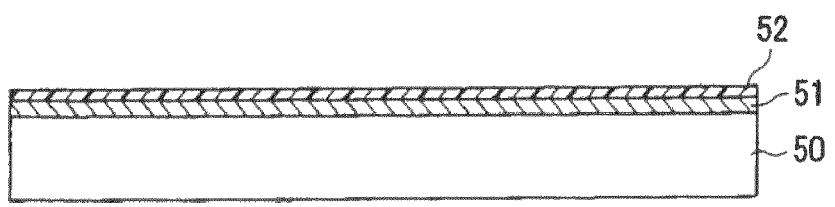
Figure 9:
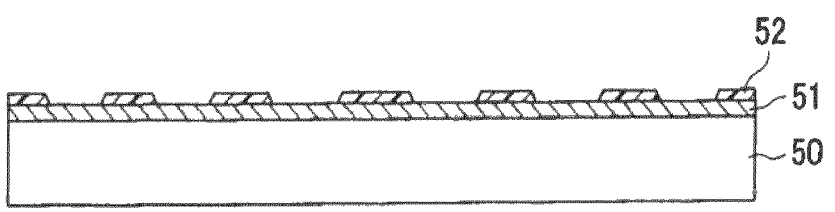
Figure 9:
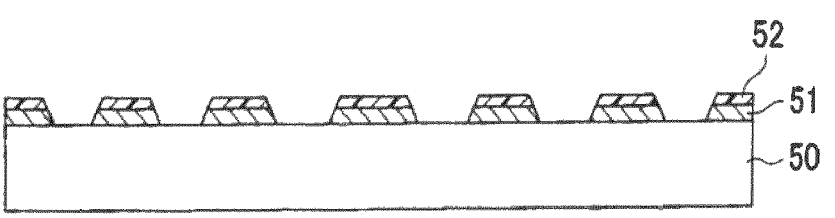
Figure 10:
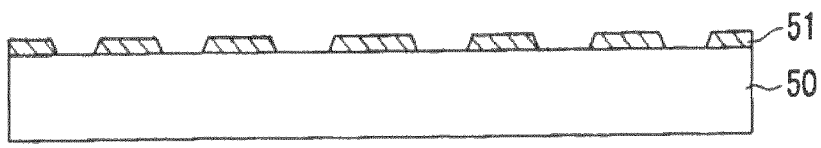
FIG. 10 are diagrammatic cross-sectional views of a glass substrate having an electronic circuit for explaining a conventional circuit pattern formation method ((f) to (j)).
Figure 10:
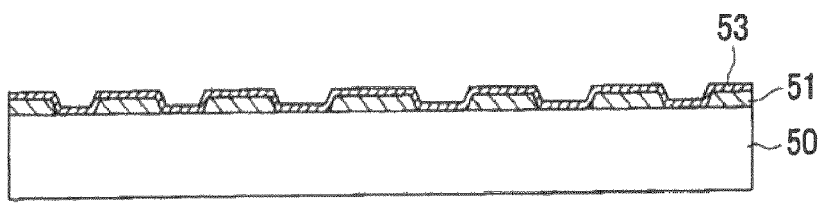
Figure 10:
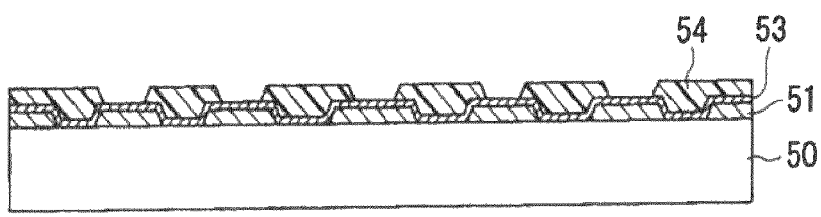
Figure 10:
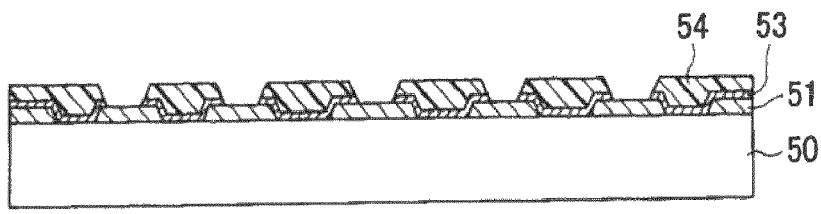
Figure 10:
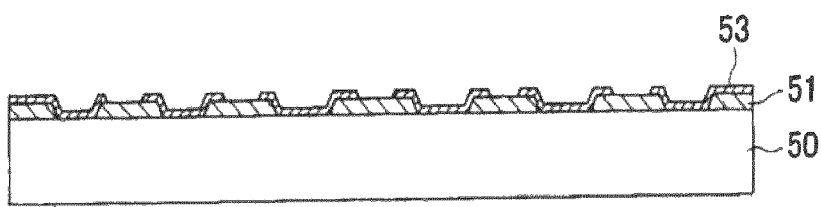

A cross-section of this glass substrate A4 was observed by an optical microscope and an electron microscope. Then, the thickness of the low-melting point glass layer was measured. As a result, this thickness was found to be 30 μm. Also, the compatible layer had a thickness of about 3.5 μm, and it was confirmed that a laser irradiation defect was dissipated (see FIGS. 8(a) and 8(b)).

Also, this glass substrate A4 was measured for a visible light transmittance by a standard C light source. As a result, the visible light transmittance was 84%. Also, the presence of a laser irradiation defect could not be confirmed.

Furthermore, this glass substrate A4 was measured for a strain stress using an ellipsometer. As to the measurement method, an area of the glass substrate A4 covered by the low-melting point glass was cut out in a width of 15 mm. The cross-section was optically polished and then observed in the cross-sectional direction by a polarization microscope (interferometer), and a strain stress (kg/cm²) of the glass substrate surface part was calculated by a photoelasticity method.

Then, it was confirmed that the strain fell within a negligible range (±12 kg/cm²). Therefore, it was confirmed that the glass substrate was free from an abnormal warp and was not reduced in the strength. Also, when PDP was made to discharge a light using the foregoing glass substrate, a display defect could not be viewed.

Example 2

Tests were carried out under the same operations and conditions and the like as in Example 1, except for using a low-melting point glass having a softening point of 620° C. in place of the low-melting point glass having a softening point of 478° C. as used in Example 1.

Then, a cross-section of the glass substrate having a low-melting point glass formed thereon was observed by an optical microscope and an electronic microscope. As a result, the low-melting point glass had a thickness of 20 μm. Also, the compatible layer had a thickness of 0.15 μm, and it was confirmed that a laser irradiation defect was dissipated.

While the invention has been described in detail and with reference to specific embodiments thereof, it will be apparent to one skilled in the art that various changes and modifications can be made therein without departing from the spirit and scope thereof.

This application is based on Japanese Patent Application No. 2005-366410 filed Dec. 20, 2005, and the contents thereof are herein incorporated by reference.

INDUSTRIAL APPLICABILITY

In the light of the above, according to the process for producing a glass substrate having a circuit pattern of the invention, a laser irradiation defect formed by laser patterning such as stepwise irradiation can be dissipated by a simple method, and as a result, a glass substrate having a circuit pattern which is free from a laser irradiation defect can be provided. Such a glass substrate is useful as an electronic circuit board to be used for computers, communications, information home appliances, various display devices and the like.

The invention claimed is:

1. A process for producing a glass substrate having a circuit pattern, comprising:
    forming a thin film layer on a glass substrate;
    irradiating the thin film layer with laser light to form a circuit pattern by removing a portion of the thin film layer on the glass substrate;
    depositing a low-melting point glass having a softening point of from 450 to 630° C. on the glass substrate having the circuit pattern formed thereon; and
    sintering the low-melting point glass to form a low-melting point glass layer which includes the low-melting point glass sintered on the glass substrate having the circuit pattern formed thereon and to form a compatible layer between the glass substrate and the low-melting point glass layer,
    wherein the compatible layer is a layer in which material of the glass substrate and material of the low-melting point glass are mutually diffused.

2. The process for producing a glass substrate having a circuit pattern according to claim 1, wherein the compatible layer has a thickness of from 0.7 to 20 times a depth of a laser irradiation defect formed on the glass substrate upon irradiation of laser light.

3. The process for producing a glass substrate having a circuit pattern according to claim 1, wherein the compatible layer has a thickness equal to or more than a depth of a laser irradiation defect formed on the glass substrate upon irradiation of laser light.

4. The process for producing a glass substrate having a circuit pattern according to claim 1, wherein the thin film layer includes a layer comprising at least one member selected from the group consisting of metal oxides and metals.

5. The process for producing a glass substrate having a circuit pattern according to claim 4, wherein the thin film layer contains 80% by mass or more of tin oxide.

6. The process for producing a glass substrate having a circuit pattern according to claim 1, wherein the glass substrate does not include a laser irradiation defect which becomes defective in display.

7. The process for producing a glass substrate having a circuit pattern according to claim 1, wherein the thin film layer is irradiated with an excimer laser light or a YAG laser light.

8. The process for producing a glass substrate having a circuit pattern according to claim 1, wherein the low-melting point glass deposited on the glass substrate is in a powdered form contained in an organic solvent.

* * * * *